(12) United States Patent
Yang et al.

(10) Patent No.: US 8,694,938 B2
(45) Date of Patent: Apr. 8, 2014

(54) DISCRETE DEVICE MODELING

(75) Inventors: Ching-Shun Yang, Hsin-Chu (TW);
Chih Ming Yang, Hsin-Chu (TW);
Wei-Yi Hu, Hsin-Chu (TW); Yi-Kan Cheng, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/534,526

(22) Filed: Jun. 27, 2012

(65) Prior Publication Data
US 2014/0007028 A1     Jan. 2, 2014

(51) Int. Cl.
*G06F 17/50*     (2006.01)

(52) U.S. Cl.
USPC .......................................... 716/115; 716/106

(58) Field of Classification Search
USPC ................................................ 716/106, 115
See application file for complete search history.

(56) References Cited

U.S. PATENT DOCUMENTS

| | | | |
|---|---|---|---|
| 6,221,746 B1 | 4/2001 | Huang et al. | |
| 2009/0164196 A1* | 6/2009 | Saitou | 703/14 |
| 2010/0269083 A1* | 10/2010 | Sinha et al. | 716/11 |
| 2011/0079852 A1 | 4/2011 | Lander | |
| 2012/0018785 A1 | 1/2012 | Xu | |

OTHER PUBLICATIONS

"Spice", Retrieved Date: May 17, 2012, pp. 1-7, http://en.wikipedia.org/wiki/HSPICE.

* cited by examiner

*Primary Examiner* — Vuthe Siek
(74) *Attorney, Agent, or Firm* — Cooper Legal Group LLC

(57) ABSTRACT

Among other things, one or more techniques and/or systems are provided for modeling a discrete device as a macro device. That is, the discrete device can comprise one or more parasitic elements, such as parasitic resistances and/or capacitances. Because values of the parasitic elements are unknown during pre-simulation of the discrete device, the discrete device can be modeled as a macro device, which can be used during pre-simulation to take into account the parasitic elements. For example, specified parameters, such as channel length, can be used to obtain a set of RC values that specify predicted values for the one or more parasitic elements of the discrete device. The discrete device can be modeled as the macro device using the set of RC values. In this way, the macro device can be used during pre-simulation to take into account the parasitic effects of parasitic elements of the discrete device.

20 Claims, 8 Drawing Sheets

__US 8,694,938 B2__

DISCRETE DEVICE MODELING

BACKGROUND

Modeling may be implemented for numerous resource conservation and/or other purposes, such as to test a device before a physical manifestation of the device is produced. For example, a circuit comprising one or more discrete devices (e.g., transistors, electrical components, mechanical components, etc.) can be designed within a design kit environment, such as a process design kit (PDK). A design cycle of the circuit can comprise schematic design for the circuit, pre-simulation of the schematic, physical layout design for the circuit, verification between the schematic and the physical layout, and/or simulation of the physical layout.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Among other things, one or more systems and/or techniques for modeling a discrete device as a macro device are provided herein. A discrete device can comprise a mechanical and/or electrical device (e.g., a transistor, a MOSFET, a FinFET, etc.) within a circuit. The discrete device can have parasitic elements, such as parasitic resistances and/or parasitic capacitances. As provided herein, the discrete device can be modeled as a macro device that comprises predicted values for parasitic elements of the discrete device. The macro device can be used to represent the discrete device within a design kit environment (e.g., within a schematic or a physical layout of the circuit). In this way, the macro device can be used during a pre-simulation phase for a circuit to take into account parasitic effects of the parasitic elements of the discrete device.

In one example, one or more specified parameters associated with a discrete device are received (e.g., a user can specify a channel length, a fin count, and/or a finger count for a FinFET device). A set of RC values are obtained from an RC data structure (e.g., a table mapping user specified parameters to predicted values for parasitic elements) based upon the one or more specified parameters. The set of RC values can correspond to one or more parasitic elements for the discrete device. The discrete device is modeled as a macro device based upon the set of RC values. That is, the macro device corresponds to the discrete device and the one or more parasitic elements for the discrete device. In this way, the macro device can be utilized during pre-simulation of a circuit to take into account parasitic effects of the one or more parasitic elements of the discrete device.

To the accomplishment of the foregoing and related ends, the following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DETAILED DESCRIPTION

Figure 1:
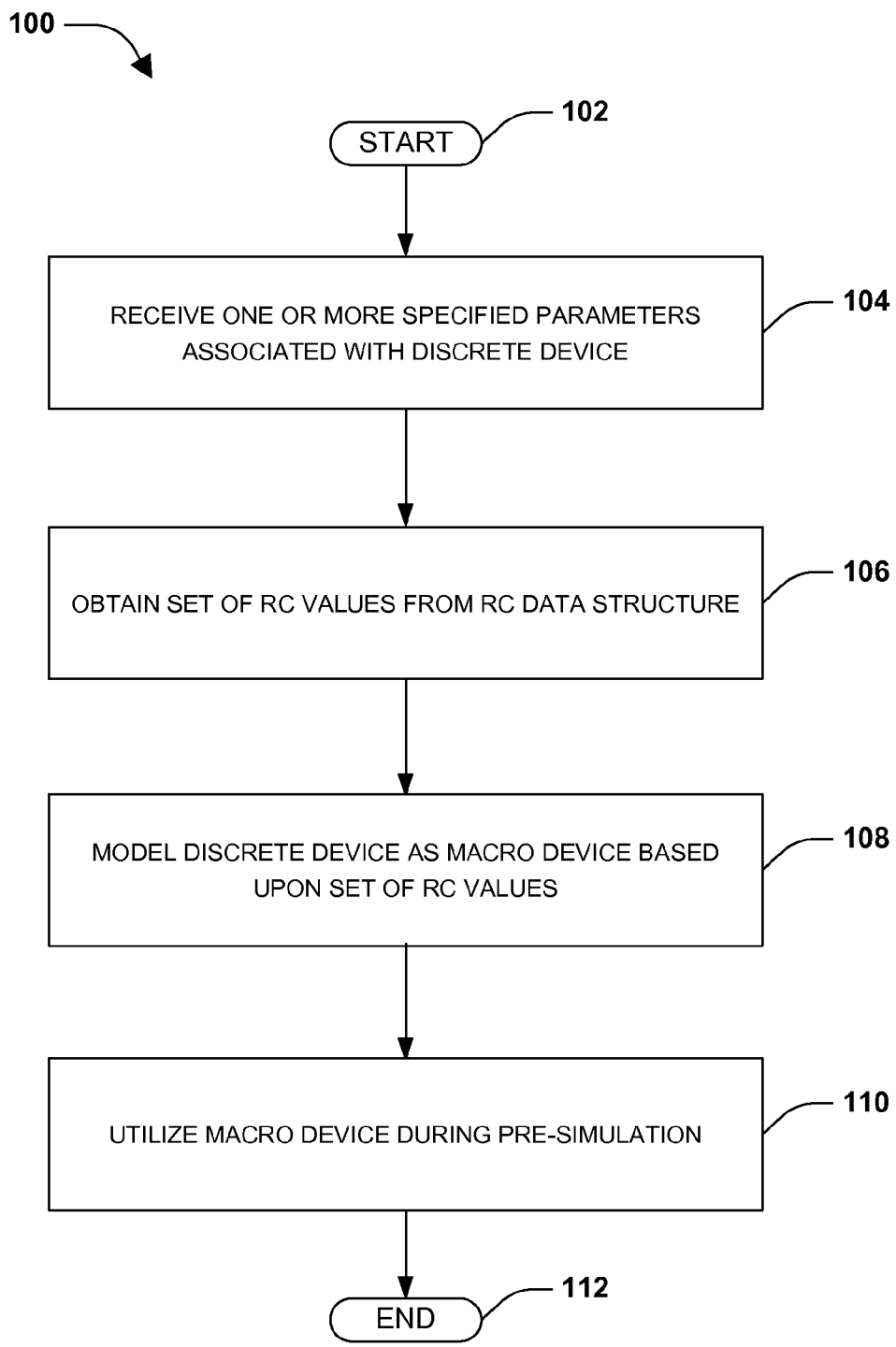
FIG. 1 is a flow diagram illustrating an example method of modeling a discrete device as a macro device.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

Many discrete devices, such as transistors, produce parasitic capacitances and/or resistances. For example, a FinFET device (e.g., a fin-based multi-gate transistor) can comprise parasitic resistance elements near the source, drain, and gate, and can comprise parasitic capacitance elements between the gate and drain and between the gate and source. The difficulty and time involved with developing a circuit comprising one or more discrete devices can significantly increase because parasitic effects of the parasitic elements are unknown to a developer during design of the circuit, such as during pre-simulation. Accordingly, as provided herein, a discrete device is modeled as a macro device that takes into account one or more parasitic elements of the discrete device. The macro device can be utilized during pre-simulation of the circuit to take into account the parasitic effects. In this way, the developer may efficiently design the circuit (e.g., the difficulty and time in developing the circuit can be mitigated) because the developer can take into account parasitic effects of the discrete device.

One embodiment of modeling a discrete device as a macro device is illustrated by an exemplary method 100 in FIG. 1. At 102, the method starts. In one example, a circuit can be designed within a design kit environment. For example, the design kit environment can provide spice simulation functionality, layout verse schematic (LVS) verification functionality, RC extraction functionality, and/or other design functionality. The circuit can comprise one or more discrete devices, such as a transistor (e.g., a FinFET device). A design cycle of the circuit can comprise various phases, such as schematic design for the circuit, pre-simulation of the schematic of the circuit, physical layout design for the circuit, verification between the schematic and the physical layout, RC extraction for the physical layout (e.g., extraction of parasitic elements within the circuit), and/or simulation of the physical layout based upon the RC extraction. Predicting values for parasitic elements of a discrete device early in the design cycle can mitigate design time of the circuit because a developer of the circuit can take into consideration the parasitic effects of the parasitic elements (e.g., during pre-simulation, schematic design, and/or physical layout). Accordingly, the discrete device can be modeled as a macro device that comprises predicted values for parasitic elements of the discrete device. The macro device can be utilized during pre-simulation of the circuit to into account the parasitic effects of the parasitic elements of the discrete device.

Figure 6:
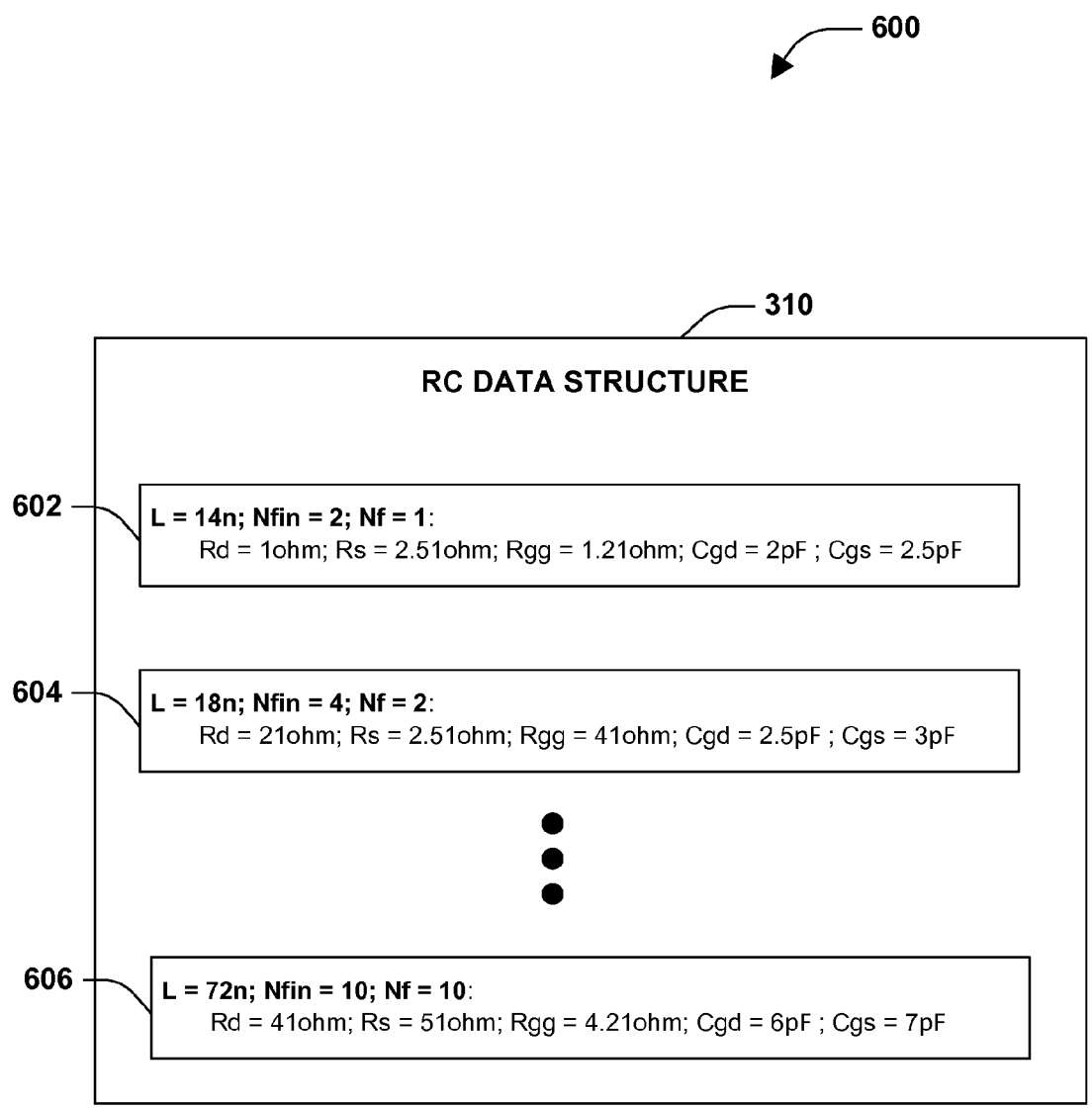
FIG. 6 is an illustration of an example of an RC data structure.

Accordingly, one or more specified parameters associated with a discrete device to be modeled are received, at 104. For example, a developer can specify a channel length, a fin count, and/or a finger count for a FinFET device as specified parameters. It may be appreciated that a variety of other parameters may be specified for the discrete device (e.g., which may be other than a FinFET). At 106, a set of RC values (e.g., a predicted value for a parasitic resistance element, a predicted value for a parasitic capacitance element, etc.) are obtained from an RC data structure (e.g., a table) based upon the one or more specified parameters. The RC data structure maps specified parameters to predicted values for parasitic elements of the discrete device. It can be appreciated that one example of an RC data structure is illustrated in FIG. 6. In one example of obtaining the set of RC values, one or more callback functions, associated with a design kit environment, can be invoked to query the RC data structure to obtain the set of RC values. In this way, the set of RC values comprise predicted values (e.g., an RC value) that correspond to one or more parasitic elements for the discrete device. For example, an RC value can comprise a predicted value for a parasitic resistance element (e.g., an $R_{gg}$, an $R_d$, and/or an $R_s$ parasitic resistance for a FinFET device) and/or a parasitic capacitance element (e.g., a $C_{gd}$ and/or a $C_{gs}$ for a FinFET device).

At 108, the discrete device is modeled as the macro device based upon the set of RC values. It may be appreciated that one example of modeling a discrete device 304 as a macro device 316 is illustrate in FIG. 3. The macro device corresponds to the discrete device and the one or more parasitic elements for the discrete device. For example, the macro device can comprise a gate, drain, source and/or other elements of a transistor device, and can comprise a parasitic resistance element associated with the gate ($R_{gg}$), a parasitic resistance element associated with the drain ($R_d$), a parasitic resistance element associated with the source ($R_s$), a parasitic capacitance element between the gate and drain ($C_{gd}$), a parasitic capacitance between the gate and source ($C_{gs}$), and/or other parasitic elements for the transistor device.

In one example of modeling the discrete device as the macro device, a netlist is created based upon the set of RC values (e.g., an asci file describing parameters of nodes, wires, devices, etc. within the discrete device, within a circuit representing the discrete device and/or within a circuit within which the discrete device is comprised). The netlist comprises a description of the discrete device and the one or more parasitic elements for the discrete device (e.g., the netlist can comprise a parasitic RC network netlist for the discrete device). In this way, the netlist can be used to model the discrete device as the macro device for use during pre-simulation of the circuit, or rather a schematic design thereof, to take into account the parasitic effects of parasitic elements of the discrete device.

At 110, the macro device can be utilized during pre-simulation of a circuit to take into account the one or more parasitic elements of the discrete device. In one example, a schematic of the circuit can be pre-simulated to obtain a pre-simulation functional output describing the circuit. In another example, the netlist, describing the discrete device, can be used during pre-simulation of the schematic. In this way, the developer may efficiently design the circuit because the parasitic effects of the discrete device can be taken into account during pre-simulation of the schematic/circuit. The pre-simulation functional output can be compared with a physical layout of the circuit to verify functional similarity between the schematic and the physical layout. For example, a layout verse schematic (LVS) technique can be performed upon the physical layout and the pre-simulation functional output to verify functional similarity.

RC extraction can be performed for the circuit to obtain extracted RC values, such as parasitic values for the circuit and/or discrete devices therein. For example, the RC extraction can be performed upon the physical layout that was verified as functionally similar to the schematic. In one example, the extracted RC values can correspond to parasitic elements between physical layers of the circuit and/or of discrete devices therein. Because the macro device takes into account the parasitic elements of the discrete device, a Resistor short and Capacitor open configuration can be utilized for the one or more parasitic elements within the macro device to mitigate double counting such parasitic elements. That is, the pre-simulation of the schematic (e.g., based upon the netlist describing the parasitic elements of the discrete device) took into account the parasitic elements defined within the macro device. In this way, the circuit can be simulated based upon the extracted RC values without double counting parasitic elements of the discrete device that were taken into account during pre-simulation of the schematic. At 112, the method ends.

Figure 2:
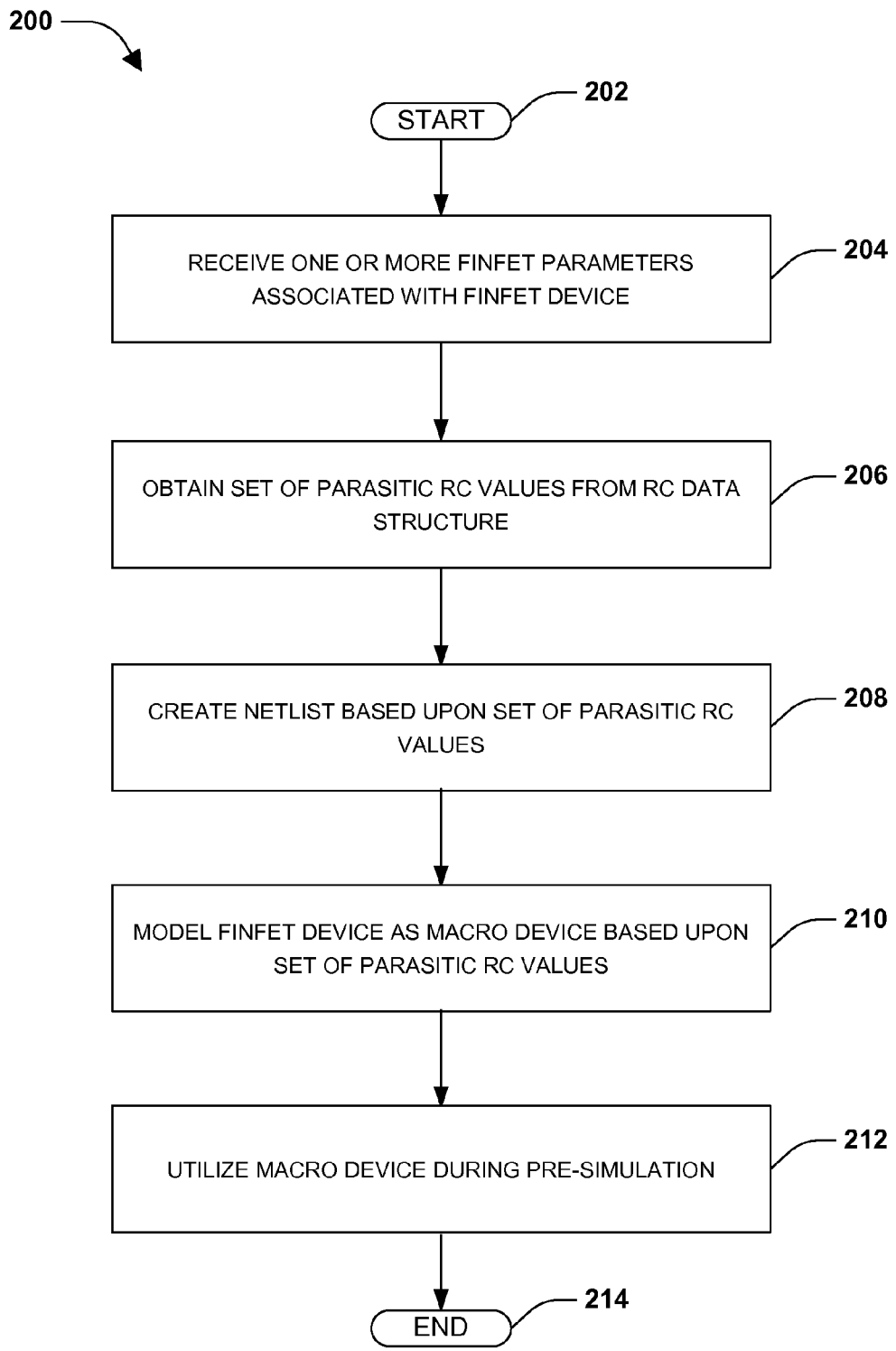
FIG. 2 is a flow diagram illustrating an example method of modeling a discrete device as a macro device.

One embodiment of modeling a discrete device, such as a FinFET device, for example, as a macro device is illustrated by an exemplary method 200 in FIG. 2. That is, while FIG. 2 is discussed with regard to a FinFET device, the disclosure is not meant to be so limited. For example, 'FinFET device' could be replaced with 'discrete device' and 'FinFET parameters' could be replaced with 'specified parameters', for example, in the following description of FIG. 2. At 202, the method starts. At 204, one or more FinFET parameters associated with a FinFET device to be modeled are received. For example, a developer can specify a channel length, a fin count, a finger count, and/or other parameters for the FinFET device. At 206, a set of parasitic RC values are obtained from an RC data structure (e.g., a table comprising mappings of FinFET parameters to predicted values of parasitic elements) based upon the one or more FinFET parameters. In this way, the set of parasitic RC values can correspond to one or more parasitic elements for the FinFET device. For example, the set of parasitic RC values can comprise predicted values for an $R_{gg}$ resistance element (e.g., a parasitic resistance for a gate of the FinFET device), an $R_d$ resistance element (e.g., a parasitic resistance for a drain of the FinFET device), an $R_s$ resistance element (e.g., a parasitic resistance for a source of the FinFET device), a $C_{gd}$ capacitance element (e.g., a parasitic capacitance between the gate and drain of the FinFET device), a $C_{gs}$ capacitance element (e.g., a parasitic capacitance between the gate and source of the FinFET device), and/or other parasitic elements.

At 208, a netlist can be created based upon the set of parasitic RC values. For example, a netlist procedure can be invoked to create the netlist to describe a circuit (e.g., nodes, wires, devices, and/or other elements of the circuit). The netlist can comprise a description of the FinFET device and the one or more parasitic elements for the FinFET device. At 210, the FinFET device can be modeled as a macro device based upon the netlist (e.g., the netlist can be used to describe the macro device during pre-simulation). The macro device corresponds to the FinFET device (e.g., a source, a drain, a gate, and/or other elements of the FinFET device) and the one or more parasitic elements for the FinFET device (e.g., predicted values for the parasitic elements). In this way, a developer can efficiently design a circuit (e.g., a schematic of the circuit, a physical layout of the circuit, etc.) by taking into account the parasitic effects of parasitic elements of the FinFET device. At 212, the macro device can be utilized during pre-simulation of a circuit (e.g., a schematic of the circuit) to take into account the one or more parasitic elements of the FinFET device. A pre-simulation functional output describing the circuit, such as behavior of the circuit, can be obtained from the pre-simulation. At 214, the method ends.

Figure 3:
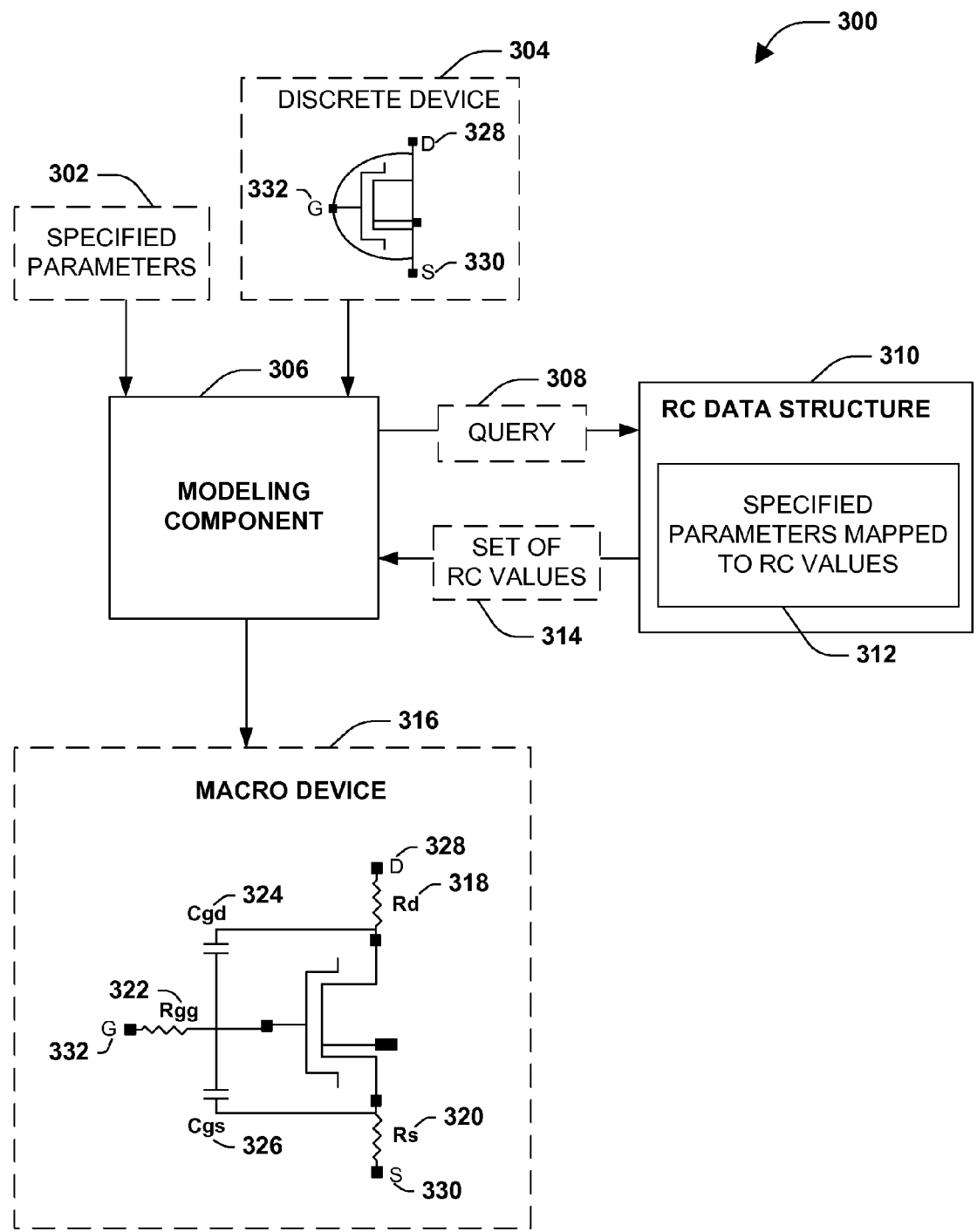
FIG. 3 is component block diagram illustrating an example system for modeling a discrete device as a macro device.

FIG. 3 illustrates an example of a system 300 configured for modeling a discrete device 304 as a macro device 316. The system 300 can be associated with a design kit environment through which a developer can design circuits (e.g., integrated circuits, transistors, electrical components, processors, etc.). The development cycle of a circuit can comprise schematic design for the circuit, pre-simulation of the schematic, physical layout design for the circuit, verification between the schematic and the physical layout, RC extraction of parasitic elements for the physical layout, and/or simulation of the physical layout based upon the RC extraction. As provided herein parasitic elements of discrete devices within a circuit are modeled (e.g., during pre-simulation) so that a developer can take such parasitic elements into account during creation of the circuit (e.g., during schematic design).

The system 300 comprises a modeling component 306. The modeling component 306 is configured to model the discrete device 304 as the macro device 316, which can be used during pre-simulation of the circuit. In one example, the discrete device 304 can comprise a transistor, such as a FinFET device. The discrete device 304 can comprise a drain 328, a source 330, a gate 332, and/or other elements. However, parasitic elements for the discrete device 304 may be unknown due to the complexity in modeling such parasitic elements. Accordingly, the modeling component 306 is configured to create the macro device 316 to take into account one or more predicted parasitic elements of the discrete device 304. In this way, the macro device 304 represents the discrete device 304 and the one or more predicted parasitic elements of the discrete device 304.

In one example, the modeling component 306 is configured to receive one or more specified parameters 302 associated with the discrete device 304. The modeling component 306 is configured to query 308 an RC data structure 310 (e.g., a table mapping specified parameters to RC values 312, such as predicted values for parasitic elements) using the specified parameters 302 to obtain a set of RC values 314 for one or more parasitic elements of the discrete device 304. For example, the set of RC values 314 can comprise predicated parasitic values for an $R_{gg}$ resistance element 322, an $R_d$ resistance element 318, an $R_s$ resistance element 320, a $C_{gd}$ capacitance element 324, a $C_{gs}$ capacitance element 326, and/or other predicted parasitic elements not illustrated. In one example, the modeling component 306 is configured to model the discrete device 304 as the macro device 316 using the set of RC values 314. In another example, the modeling component 306 is configured to create a netlist, describing the discrete device 304 and the one or more predicted parasitic elements, based upon the set of RC values. The modeling component can model the discrete device 304 as the macro device 316 based upon the netlist. In this way, the macro device 316 corresponds to the discrete device 304 (e.g., drain 328, source 330, gate 332) and the one or more predicted parasitic elements (e.g., $R_{gg}$ resistance element 322, $R_d$ resistance element 318, $R_s$ resistance element 320, $C_{gd}$ capacitance element 324, and $C_{gs}$ capacitance element 326).

Figure 4:
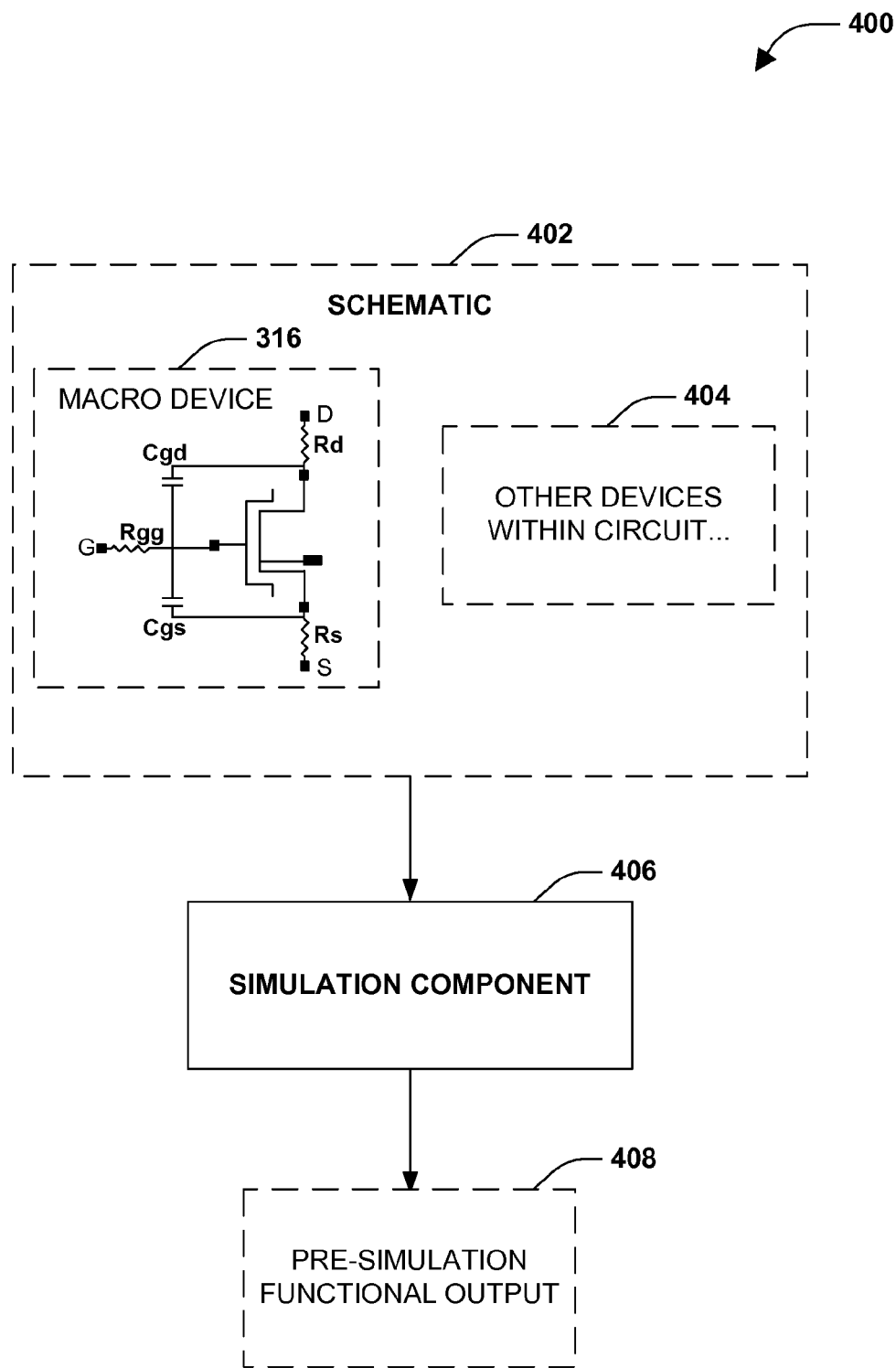
FIG. 4 is component block diagram illustrating an example system for simulating a circuit comprising a macro device.

FIG. 4 illustrates an example of a system 400 configured for simulating a circuit comprising a macro device 316. It can be appreciated that in one example, a discrete device (not shown) can be modeled as the macro device 316 to take into account predicted parasitic elements of the discrete device. That is, the macro device 316 represents the discrete device (e.g., a FinFET transistor comprising a source, drain, gate, and/or other elements) and one or more predicted parasitic elements (e.g., $R_{gg}$ resistance element, $R_d$ resistance element, $R_s$ resistance element, and $C_{gd}$ capacitance element, $C_{gs}$ capacitance element, etc.). In this way, a schematic 402 of the circuit can comprise the macro device 316 and/or other devices 404 within the circuit.

The system 400 comprises a simulation component 406 configured to pre-simulate the schematic 402 of the circuit to obtain a pre-simulation functional output 408 for the circuit. The pre-simulation functional output 408 can describe the behavior of the circuit. In one example, the simulation component 406 can invoke spice analysis techniques to pre-simulate the schematic 402. In another example, the simulation component 406 can utilize a netlist describing the circuit (e.g., the macro device 316 and/or the other devices 404) to pre-simulate the circuit. In this way, the pre-simulation functional output 408 can describe the functionality of the circuit designed within the schematic 402, which can comprise parasitic effects of the one or more predicted parasitic elements represented by the macro device 316.

Figure 5:
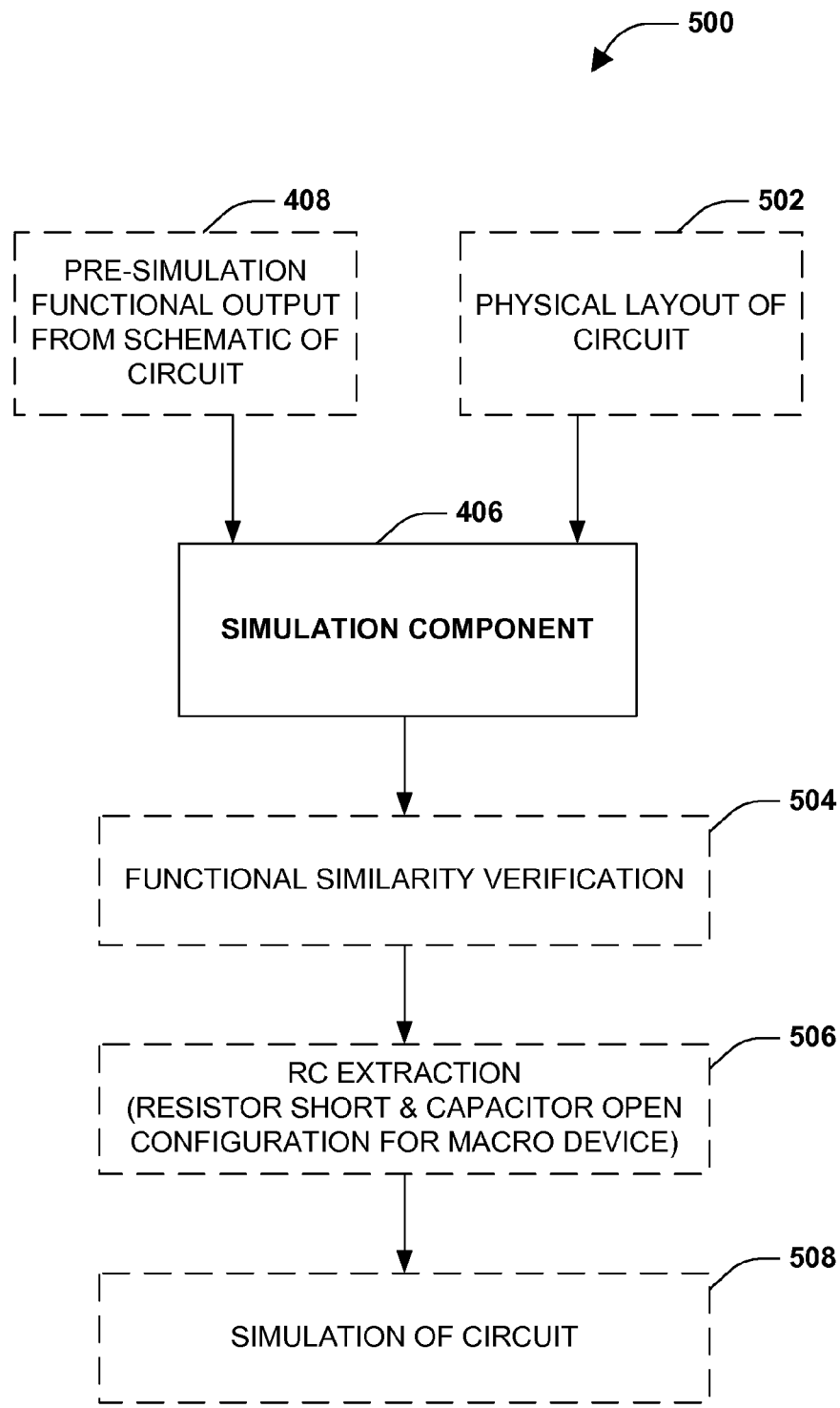
FIG. 5 is component block diagram illustrating an example system for simulating a circuit comprising a macro device.

FIG. 5 illustrates an example of a system 500 configured for simulating a circuit comprising a macro device. It may be appreciated that in one example, the simulation component 406 may have created a pre-simulation functional output 408 of the circuit from a schematic comprising the macro device. The system 500 comprises the simulation component 406. The simulation component 406 is configured to obtain a physical layout 502 of the circuit. For example, a developer of the circuit may have designed the physical layout 502 by physically placing representations of wires, nodes, discrete devices, and/or other circuit elements within a design kit environment. The simulation component 406 can be configured to verify functional similarity 504 between the schematic, represented by the pre-simulation functional output 408, and the physical layout 502. For example, the simulation component 406 can invoke a layout verse schematic (LVS) technique to verify functional similarity 504.

The simulation component 406 is configured to perform RC extraction for the circuit to obtain extracted RC values for the circuit. The simulation component 406 can perform RC extraction 506 upon the physical layout 502 to obtain extracted RC values corresponding to parasitic values for the circuit (e.g., parasitic values between physical layers, such as routing layers). In one example, the simulation component 406 can invoke a 2D solver and/or a 3D solver to perform RC extraction. Because the macro device represents the discrete device and the one or more predicted parasitic elements (e.g., which were taken into account during pre-simulation), a Resistor short and Capacitor open configuration can be utilized for the macro device to discount the one or more predicted parasitic elements during RC extraction so that such predicted parasitic elements (e.g., which were taken into account during pre-simulation) are not counted again during RC extraction. That is, the Resistor short and Capacitor open configuration shorts the parasitic resistance elements and opens the parasitic capacitance elements within the macro device so that the RC extraction does not take such predicted parasitic elements into account.

The simulation component 406 is configured to simulate 508 the circuit. For example, the simulation component 406 can simulate 508 the physical layout 502 based upon the extracted RC values. Design cycle time and/or difficulty (e.g., schematic design, physical layout design, functional similarity verification, RC extraction, and/or simulation) can be mitigated because the developer can utilize the macro device during the design cycle (e.g., during schematic design) to take into account parasitic effects of the discrete device.

FIG. 6 illustrates an example 600 of an RC data structure 310. The RC data structure 310 comprises mappings of specified parameters to predicted values for parasitic elements (e.g., predicted parasitic elements) of discrete devices. In one example, a first mapping 602 for a FinFET device may map specified parameters (e.g., channel length=14 n, number of fins=2, and number of fingers=1) to predicted values of parasitic elements for the FinFET device (e.g., $R_d$=1 ohm, $R_s$=2.51 ohm, $R_{gg}$=1.21 ohm, and $C_{gd}$=2 pF, and $C_{gs}$=2.5 pF). It may be appreciated that the values specified in example 600 are merely used for illustrative purposes and/or that such a data structure may comprise specified parameters and predicted values for other than a FinFET device. In another example, a second mapping 604 for the FinFET device may map specified parameters (e.g., channel length=18 n, number of fins=4, and number of fingers=2) to predicted values of parasitic elements for the FinFET device (e.g., $R_d$=21 ohm, $R_s$=2.51 ohm, $R_{gg}$=41 ohm, and $C_{gd}$=2.5 pF, and $C_{gs}$=3 pF). In another example, a third mapping 606 for the FinFET device may map specified parameters (e.g., channel length=72 n, number of fins=10, and number of fingers=10) to predicted values of parasitic elements for the FinFET device (e.g., $R_d$=41 ohm, $R_s$=51 ohm, $R_{gg}$=4.21 ohm, and $C_{gd}$=6 pF, and $C_{gs}$=7 pF). In this way, specified parameters for the FinFET device can be used to query the RC data structure 310 to obtain a set of RC values associated with parasitic elements of the FinFET device. The set of RC values can comprise predicted values for the parasitic elements of the FinFET device (e.g., which may be obtained via interpolation and/or the like in the absence of exact match(es)). The set of RC values can be utilized in modeling the FinFET device as a macro device that takes into account the parasitic elements. A developer can utilize the macro device during design of a circuit to take into account the parasitic effects of a discrete device, such as the FinFET device.

Figure 7:
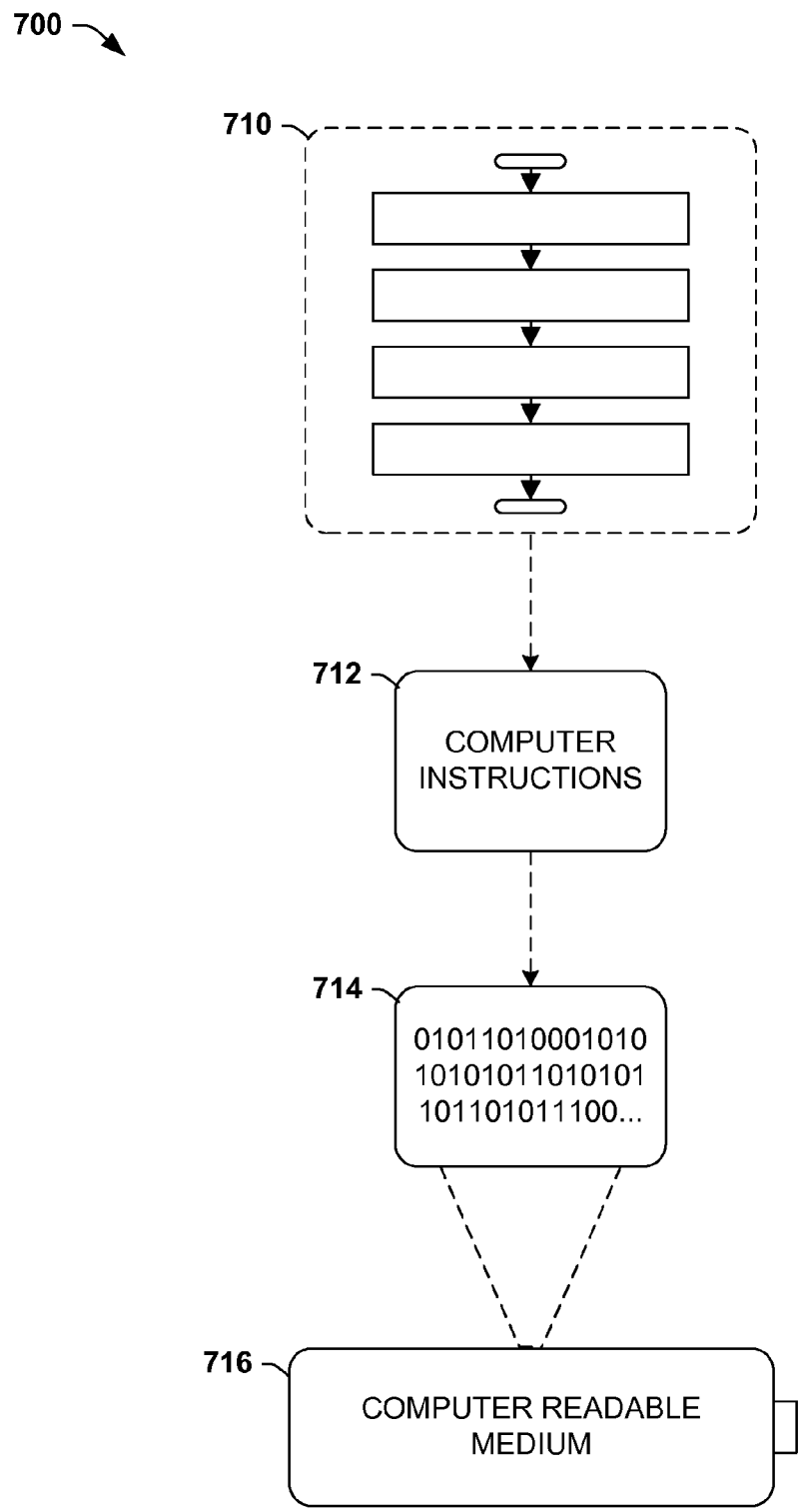
FIG. 7 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 7, wherein the implementation 700 comprises a computer-readable medium 716 (e.g., a CD-R, DVD-R, flash drive, a platter of a hard disk drive, etc.), on which is encoded computer-readable data 714. This computer-readable data 714 in turn comprises a set of computer instructions 712 configured to operate according to one or more of the principles set forth herein. In one such embodiment 700, the processor-executable computer instructions 712 may be configured to perform a method 710, such as at least some of the exemplary method 100 of FIG. 1 and/or at least some of exemplary method 200 of FIG. 2, for example. In another such embodiment, the processor-executable instructions 712 may be configured to implement a system, such as at least some of the exemplary system 300 of FIG. 3, at least some of the exemplary system 400 of FIG. 4, and/or at least some of the exemplary system 500 of FIG. 5, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 8:
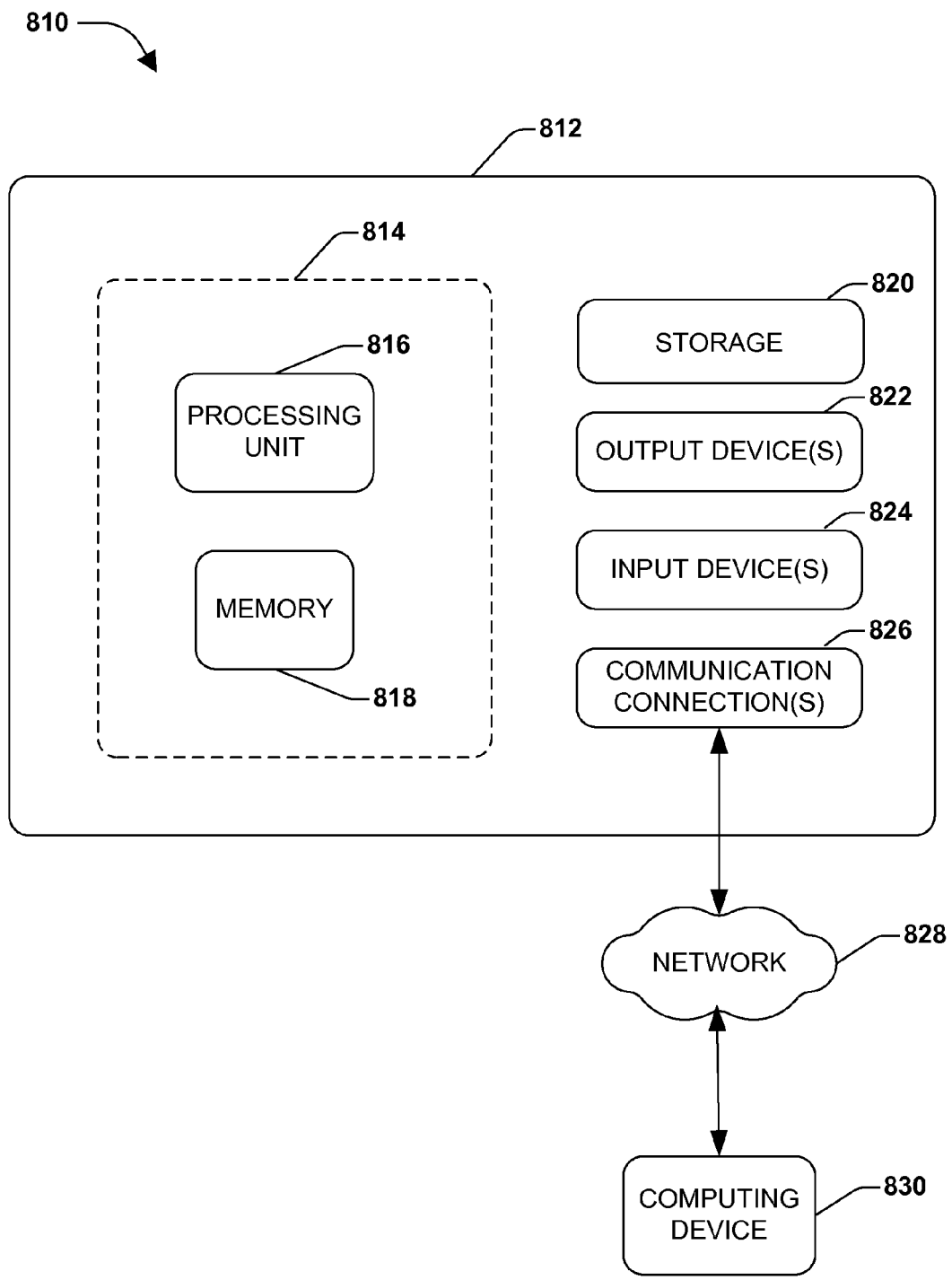
FIG. 8 illustrates an example computing environment wherein one or more of the provisions set forth herein may be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 810 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In one embodiment, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device (s) 822 may be connected to device 812 via a wired connection, wireless connection, or any combination thereof. In one embodiment, an input device or an output device from another computing device may be used as input device(s) 824 or output device(s) 822 for computing device 812. Device 812 may also include communication connection(s) 826 to facilitate communications with one or more other devices.

According to one aspect of the instant disclosure, a system for modeling a discrete device as a macro device is provided. The system comprises a modeling component configured to model a discrete device as a macro device for simulation during a pre-simulation phase of a schematic for a circuit comprising the discrete device, where the macro device represents the discrete device and one or more predicted parasitic elements of the discrete device.

According to one aspect of the instant disclosure, a method for modeling a discrete device as a macro device is provided. The method comprises receiving one or more specified parameters associated with a discrete device to be modeled, and obtaining a set of RC values from an RC data structure based upon the one or more specified parameters, where the set of RC values corresponds to one or more parasitic elements for the discrete device. The method also comprises modeling the discrete device as a macro device based upon the set of RC values, where the macro device corresponds to the discrete device and the one or more parasitic elements for the discrete device, and utilizing the macro device during pre-simulation of a circuit comprising the discrete device to take into account the one or more parasitic elements of the discrete device.

According to one aspect of the instant disclosure, a computer-readable medium comprising processor-executable instructions that when executed perform a method for modeling a discrete device as a macro device is provided. The method comprises receiving one or more specified parameters associated with a discrete device to be modeled, and obtaining a set of parasitic RC values from an RC data structure based upon the one or more specified parameters, where the set of parasitic RC values corresponds to one or more parasitic elements for the discrete device. The method also comprises creating a netlist based upon the set of parasitic RC values, where the netlist comprises a description of the discrete device and the one or more parasitic elements for the discrete device, and modeling the discrete device as a macro device based upon the netlist, where the macro device corresponds to the discrete device and the one or more parasitic elements for the discrete device. The method also comprises utilizing the macro device during pre-simulation of a circuit comprising the discrete device to take into account the one or more parasitic elements of the discrete device.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B and/or the like generally means A or B or both A and B.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system for modeling a discrete device as a macro device, comprising:
a modeling component configured to:
model a discrete device as a macro device for simulation during a pre-simulation phase of a schematic for a circuit comprising the discrete device, the macro device representing the discrete device, the macro device representing one or more predicted parasitic elements of the discrete device, the one or more predicted parasitic elements corresponding to at least one of a parasitic resistance or a parasitic capacitance of the discrete device; and
obtain a set of RC values for the discrete device from an RC data structure using one or more specified parameters for the discrete device, the RC data structure mapping specified parameters to RC values, the set of RC values corresponding to the one or more predicted parasitic elements for the discrete device.

2. The system of claim 1, the discrete device corresponding to a FinFET.

3. The system of claim 1, the modeling component configured to:
model the discrete device as the macro device based upon the set of RC values.

4. The system of claim 1, the modeling component configured to:
create a netlist based upon the set of RC values, the netlist comprising a description of the discrete device and the one or more predicted parasitic elements for the discrete device; and
model the discrete device as the macro device based upon the netlist.

5. The system of claim 1, comprising:
a simulation component configured to:
pre-simulate the schematic of the circuit, during the pre-simulation phase, to obtain a pre-simulation functional output describing the circuit.

6. The system of claim 5, the simulation component configured to:
obtain a physical layout of the circuit;
verify functional similarity between the physical layout and the pre-simulation functional output;
perform RC extraction for the circuit to obtain extracted RC values for the circuit, comprising utilizing a Resistor short and a Capacitor open configuration for the one or more predicted parasitic elements for the discrete device; and
simulate the circuit based upon the extracted RC values.

7. The system of claim 1, a specified parameter comprising at least one of a channel length, a fin count, or a finger count.

8. A method for modeling a discrete device as a macro device, comprising:

receiving one or more specified parameters associated with a discrete device to be modeled;
obtaining a set of RC values from an RC data structure based upon the one or more specified parameters, the set of RC values corresponding to one or more parasitic elements for the discrete device;
modeling the discrete device as a macro device based upon the set of RC values, the macro device corresponding to the discrete device and the one or more parasitic elements for the discrete device; and
utilizing the macro device during pre-simulation of a circuit comprising the discrete device to take into account the one or more parasitic elements of the discrete device, at least some of at least one of the receiving, the obtaining, the modeling, or the utilizing implemented at least in part via a processing unit.

9. The method of claim 8, the modeling comprising:
creating a netlist based upon the set of RC values, the netlist comprising a description of the discrete device and the one or more parasitic elements for the discrete device; and
modeling the discrete device as the macro device based upon the netlist.

10. The method of claim 8, the one or more parasitic elements corresponding to at least one of an $R_{gg}$ resistance element, an $R_d$ resistance element, an $R_s$ resistance element, a $C_{gd}$ capacitance element, or a $C_{gs}$ capacitance element.

11. The method of claim 8, the one or more specified parameters comprising at least one of a channel length, a fin count, or a finger count associated with the discrete device.

12. The method of claim 8, the utilizing comprising:
pre-simulating a schematic of the circuit to obtain a pre-simulation functional output describing the circuit.

13. The method of claim 12, comprising:
obtaining a physical layout of the circuit comprising the macro device; and
verifying functional similarity between the physical layout and the pre-simulation functional output.

14. The method of claim 8, comprising:
performing RC extraction for the circuit to obtain extracted RC values for the circuit, the performing RC extraction comprising utilizing a Resistor short and a Capacitor open configuration for the one or more parasitic elements for the discrete device.

15. The method of claim 14, comprising:
simulating the circuit based upon the extracted RC values.

16. The method of claim 8, the obtaining a set of RC values comprising:
invoking one or more callback functions to obtain the set of RC values from the RC data structure based upon the one or more specified parameters.

17. A non-transitory computer-readable medium comprising processor-executable instructions that when executed perform a method for modeling a discrete device as a macro device, comprising:
receiving one or more specified parameters associated with a discrete device to be modeled;
obtaining a set of parasitic RC values from an RC data structure based upon the one or more specified parameters, the set of parasitic RC values corresponding to one or more parasitic elements for the discrete device;
creating a netlist based upon the set of parasitic RC values, the netlist comprising a description of the discrete device and the one or more parasitic elements for the discrete device;

modeling the discrete device as a macro device based upon the netlist, the macro device corresponding to the discrete device and the one or more parasitic elements for the discrete device; and utilizing the macro device during pre-simulation of a circuit comprising the discrete device to take into account the one or more parasitic elements of the discrete device.

18. The non-transitory computer-readable medium of claim 17, the one or more specified parameters comprising at least one of a channel length, a fin count, or a finger count.

19. The non-transitory computer-readable medium of claim 17, the one or more parasitic elements corresponding to at least one of an $R_{gg}$ resistance element, an $R_d$ resistance element, an $R_s$ resistance element, a $C_{gd}$ capacitance element, or a $C_{gs}$ capacitance element.

20. The non-transitory computer-readable medium of claim 17, comprising;

pre-simulating a schematic of the circuit to obtain a pre-simulation functional output describing the circuit.

* * * * *